United States Patent [19]
Sunada

[11] Patent Number: 5,981,373
[45] Date of Patent: Nov. 9, 1999

[54] SEMICONDUCTOR DEVICE, METHOD FOR MANUFACTURING THE SAME, APPARATUS FOR MANUFACTURING THE SAME

[75] Inventor: Takeshi Sunada, Yamaguchi-ken, Japan

[73] Assignee: Kabushiki Kaisha Toshiba, Kawasaki, Japan

[21] Appl. No.: 08/720,726

[22] Filed: Oct. 1, 1996

[30] Foreign Application Priority Data

Oct. 3, 1995 [JP] Japan .................................. 7-256307

[51] Int. Cl.⁶ ................................................. H01L 21/316
[52] U.S. Cl. ........................ 438/624; 438/632; 438/783; 438/787
[58] Field of Search ..................... 438/624, 632, 438/783, 787

[56] References Cited

U.S. PATENT DOCUMENTS

| | | | |
|---|---|---|---|
| 5,334,552 | 8/1994 | Homma | 437/195 |
| 5,683,940 | 11/1997 | Yahiro | 437/195 |
| 5,700,720 | 12/1997 | Hashimoto | 437/195 |
| 5,703,404 | 12/1997 | Matsuura | 257/758 |

FOREIGN PATENT DOCUMENTS 408203892  8/1996  Japan .
8-203892  8/1996  Japan .

OTHER PUBLICATIONS

M. Matsuura et al., "Novel Self–planarizing CVD Oxide for Interlayer Dielectric Applications," *IEEE IEDM*, 1994, pp. 117–120.

*Primary Examiner*—Charles Bowers
*Assistant Examiner*—Matthew Whipple
*Attorney, Agent, or Firm*—Finnegan, Henderson, Farabow, Garrett & Dunner, L.L.P.

[57] ABSTRACT

A method of manufacturing the semiconductor device comprises elements described below;

(a) forming a wiring pattern on an insulating film on a semiconductor substrate, (b) forming a reflow $SiO_2$ film having a reflow shape by introducing $SiH_4$ gas and $H_2O_2$ gas into a reaction chamber which accommodates said semiconductor substrate and mutually reacting the $SiH_4$ and $H_2O_2$ gases in a temperature range of about $-10°$ C. to about $+10°$ C. in a vacuum of about 665 Pa or below, (c) plasma treating a surface of said reflow $SiO_2$ film by introducing a gas including fluorine into said reaction chamber and discharging plasma in said reaction chamber, and (d) heat treating said semiconductor substrate.

10 Claims, 4 Drawing Sheets

SEMICONDUCTOR DEVICE, METHOD FOR MANUFACTURING THE SAME, APPARATUS FOR MANUFACTURING THE SAME

BACKGROUND OF THE INVENTION

1. Field of the Invention

This invention relates to a method for manufacturing a semiconductor device and its manufacturing apparatus, and more particularly to a method for forming an interlayer insulating layer for a semiconductor device having a multiple wiring layer structure and its forming apparatus.

2. Description of the Related Art

With the increase of the integrality of the semiconductor device, so-called multiple wiring layer structuring which forms wiring materials in the multiple layer form on a substrate is advancing, and a manufacturing process for such semiconductor devices having the above multiple wiring layer structure is becoming complicated and extended. In particular, the process for forming the multiple wiring layer occupies a large ratio in the production cost of the semiconductor device. To lower the cost of the semiconductor device, demands for reducing the multiple wiring layer process are increasing. And, to decrease the steps in the multiple wiring layer process, an insulating layer planarization technology is significant.

As one of the technologies for planarization of the surface of an interlayer insulating layer, an APL (Advanced Planarization Layer) process has been reported (Literature: Matsuura et al., IEEE Tech. Dig., pp 117, 1994).

In the APL process, to produce the interlayer insulating layer, $SiH_4$ gas and an oxidizing agent $H_2O_2$ (hydrogen peroxide solution) are reacted in a vacuum at a low temperature (e.g., approx. 0° C.). And, as an intermediate product, $Si(OH)_4$ with a high flowing property is related to the reaction. As a result, a self-flowing (reflow) $SiO_2$ film (hereinafter referred to as the reflow $SiO_2$ film) which can be planarized on the lower wiring layer is formed.

This method can simultaneously achieve the embedding of the insulating film among wirings on the lower wiring layer and the planarization of the insulating film surface, and can complete the process up to the planarization by a single film forming, so that it can meet the demand for reducing the multiple wiring layer process.

Here, a conventional multiple wiring layer forming process will be described with reference to FIG. 1 (*a*) to FIG. 1 (*c*)

As shown in FIG. 1 (*a*), an element area (not shown) and others are formed on a semiconductor substrate 30, a lower insulation layer 31 is formed by an atmospheric pressure CVD method, and contact holes (not shown) are formed.

Then, a first wiring material (e.g., aluminum containing 1% of Si and 0.5% of Cu) for the lower wiring layer is deposited, and the wiring material is patterned by the photolithography method or the RIE (reactive ion etching) method to form a lower wiring layer 32.

And, a plasma CVD insulating film 33 is formed as a first interlayer insulating layer (base insulating film) on the lower wiring layer 32 by the ordinary plasma CVD method.

As shown in FIG. 1 (*b*), a reflow $SiO_2$ film 34 is formed by the above-described method to embed the reflow $SiO_2$ film 34 among the mutual wirings of the lower wiring layer 32 and to planarize the surface. The reflow $SiO_2$ film 34 absorbs water in the process of forming the film because of its forming process and has water in it (water which was absorbed at the time of forming the film).

And, as shown in FIG. 1 (*c*), a second plasma CVD insulating film 35 is formed as a second interlayer insulating layer (passivating layer) on the reflow $SiO_2$ film 34 by the ordinary plasma CVD method.

Then, the semiconductor substrate 30 is accommodated into a furnace anneal chamber and thermally treated (furnace anneal) at a high temperature of, e.g., 450° C. in the atmosphere for approx. 30 minutes to discharge a water content from the reflow $SiO_2$ film 34.

Next, etching is performed to make contact holes or via holes in the interlayer insulating layer, a second wiring material (e.g., aluminum containing 1% of Si and 0.5% of Cu) for an upper wiring layer is deposited, and the upper wiring layer (not shown) is formed by patterning.

But, the above-described conventional reflow $SiO_2$ film 34 forming method continuously supplies $SiH_4$ gas and $H_2O_2$ during the deposition of the reflow $SiO_2$ film 34, and the reflow $SiO_2$ film 34 formed by the above method has a high dielectric constant of approx. 4.5 to 4.7 (ordinary $SiO_2$ film by thermal oxidation has a dielectric constant of approx. 3.9).

Thus, the interlayer insulating layer containing the above reflow $SiO_2$ film 34 has a large capacity (or, wiring capacity), and the following to the insulating film having a low dielectric constant required for high-speed MOS devices and high-speed logic circuits becomes difficult. Thus, there is a disadvantage that the application to a high-speed device becomes difficult.

When the reflow $SiO_2$ film 34 is formed thick in order to decrease the capacity of the interlayer insulating layer containing the reflow $SiO_2$ film 34, the discharged amount of water from the reflow $SiO_2$ film 34 increases by the thermal treatment such as furnace anneal. And, since the reflow $SiO_2$ film 34 is suddenly shrunk, the reflow $SiO_2$ film 34 is cracked.

As a method to lower the above dielectric constant, it is effective to contain fluorine (F) into the reflow $SiO_2$ film, but by the above-described conventional reflow $SiO_2$ film 34 forming method using a low-temperature & low-pressure chemical vapor deposition (CVD) method, fluorine gas is hardly decomposed in the process of forming the reflow insulating film, so that it is difficult to include fluorine into the reflow insulating film.

Accordingly, it is necessary to devise a step of containing fluorine into the reflow insulating film. As an example, the applicant of this invention has proposed in Japanese Patent Laid Open No. 7-12410 a manufacturing method that at the time of forming the reflow $SiO_2$ film by the low-temperature & low-pressure CVD method, a fluorine-based gas in a radical state passed through a microwave waveguide is introduced into a reaction chamber to mutually react $SiH_4$ gas, $H_2O_2$ and fluorine-based gas. According to this manufacturing method, when the reflow $SiO_2$ film is formed by the low-temperature & low-pressure CVD method, fluorine can be contained into the reflow $SiO_2$ film in the process of forming the film, and it was confirmed that the dielectric constant of the reflow $SiO_2$ film is lowered to 3.6 or below.

As described above, the reflow $SiO_2$ film, which is obtained when the reflow insulating film forming technology is adopted for the interlayer insulating layer forming process in the conventional multiple wiring layer process, has a disadvantage that its dielectric constant is high.

SUMMARY OF THE INVENTION

This invention has been completed to remedy the above disadvantages, and aims to provide a method for manufacturing a semiconductor device and its manufacturing apparatus which can lower the di electric constant of the reflow insulating film which is obtained by adopting the reflow insulating film forming technology to the interlayer insulating layer forming step in the multiple wiring layer process for the semiconductor devices, and can form an interlayer insulating layer excelling in planarization at a low cost without conducting the planarizing step.

The method for manufacturing a semiconductor device according to the present invention comprises a step of forming a wiring pattern on an insulating film on a semiconductor substrate, a reflow film forming step of forming a reflow $SiO_2$ film having a reflow shape by introducing $SiH_4$ gas and $H_2O_2$ into a reaction chamber which accommodates the semiconductor substrate on which the wiring pattern has been formed and mutually reacting them in a temperature range of $-10°$ C. or more to $+10°$ C. or below in a vacuum of 665 Pa or below, a plasma treating step of plasma treating the surface of the reflow $SiO_2$ film by introducing the fluorine-based gas into the reaction chamber after the reflow film forming step and plasma discharging in a given vacuum, and a thermal treating step of performing a given thermal treatment of the semiconductor substrate.

The semiconductor manufacturing apparatus according to the present invention comprises a low-pressure CVD apparatus provided with a function of depositing a reflow $SiO_2$ film having a reflow shape onto a semiconductor substrate by introducing $SiH_4$ gas and $H_2O_2$ into a chamber which accommodates a wafer susceptor for positioning the semiconductor substrate and mutually reacting them in a vacuum of 665 Pa or below in a temperature range of $-10°$ C. or more to $+10°$ C. or below and a plasma treating function for the plasma treatment of the surface of the reflow $SiO_2$ film by introducing a fluorine-based gas into the chamber and plasma discharging in a given vacuum, and a control system for alternately selecting the two functions of the above low-pressure CVD apparatus.

By the method for manufacturing a semiconductor device and the semiconductor manufacturing apparatus according to the present invention, the dielectric constant of the reflow insulating film which can be obtained by adopting the reflow insulating film forming technology to the interlayer insulating layer forming step in the multiple wiring layer process for the semiconductor device can be easily made high, and the interlayer insulating layer excelling in planarization can be achieved at a low cost without performing a planarization process.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENTS

Embodiments of the present invention will be described in detail with reference to the drawings.

Figure 1A:
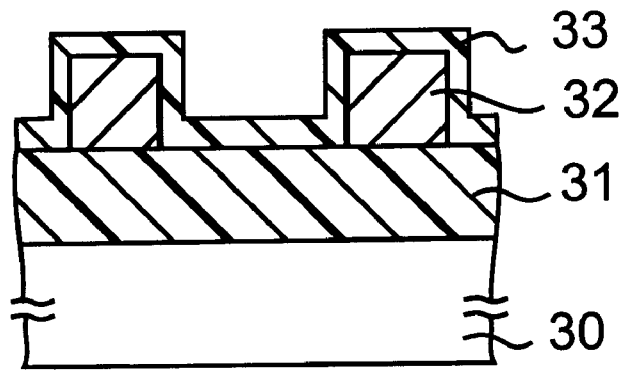
FIG. 1a–c is a sectional view showing one example of a conventional multiple wiring layer process.
Figure 1B:
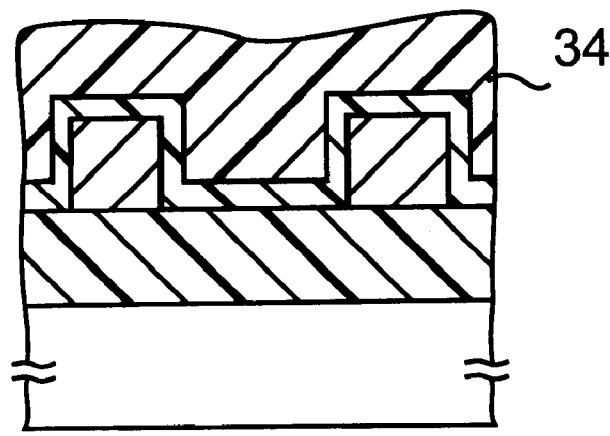
Figure 1C:
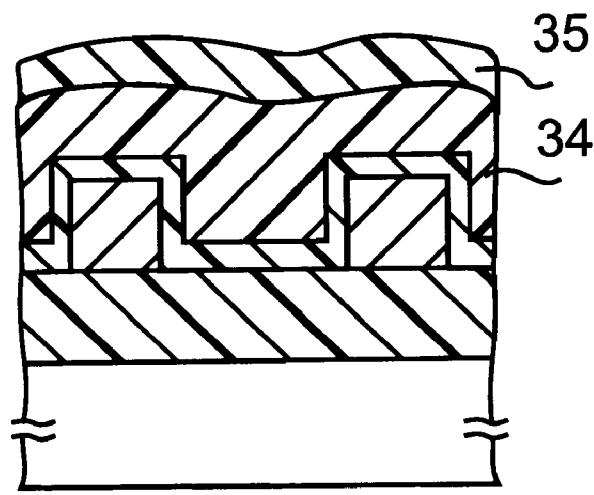
Figure 2:
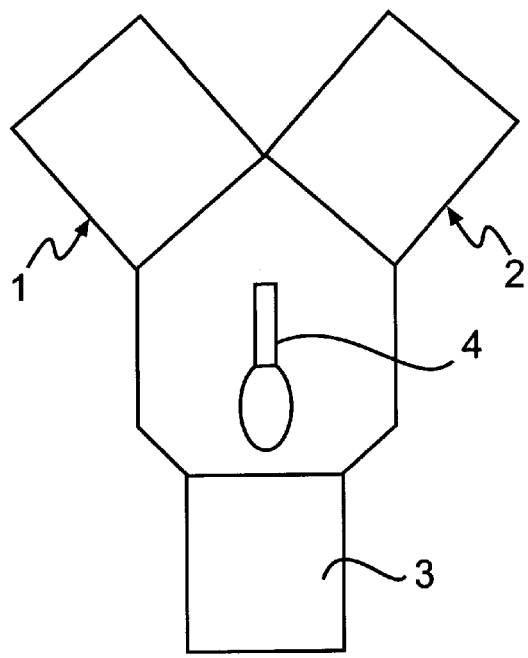
FIG. 2 is a schematic view showing one example of the structure of a multi-chamber type semiconductor manufacturing apparatus to be used in one embodiment of the method for manufacturing a semiconductor device according to the invention.

FIG. 2 is a schematic view showing one example of the structure of a multi-chamber type semiconductor manufacturing apparatus to be used in one embodiment of the method for manufacturing a semiconductor device according to the invention.

In FIG. 2, reference numeral 1 denotes a plasma CVD apparatus, 2 a low-pressure CVD apparatus, 3 a cassette load chamber in which a semiconductor substrate is accommodated and set, and 4 a robot arm for conveying (carrying in or out) the semiconductor substrate between the cassette load chamber 3 and the reaction chamber of the plasma CVD apparatus 1 or the reaction chamber of the low-pressure CVD apparatus 2.

Figure 3:
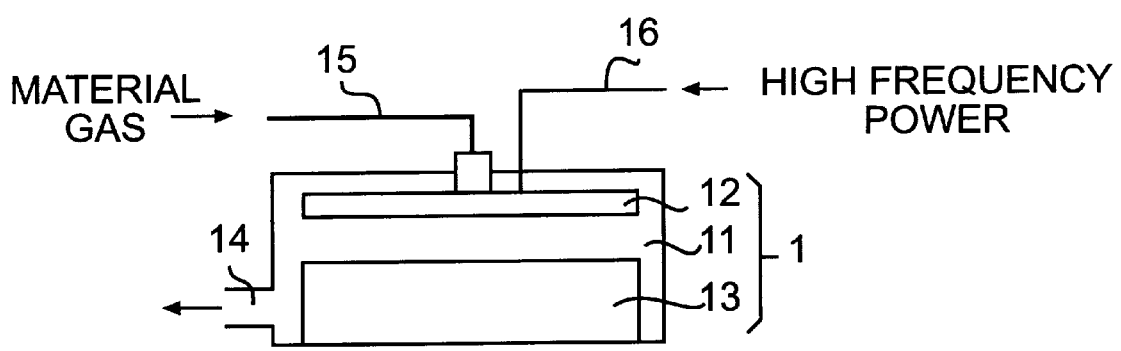
FIG. 3 is a schematic view showing one embodiment of the plasma CVD apparatus to be used for the apparatus of FIG. 1.
Figure 4:
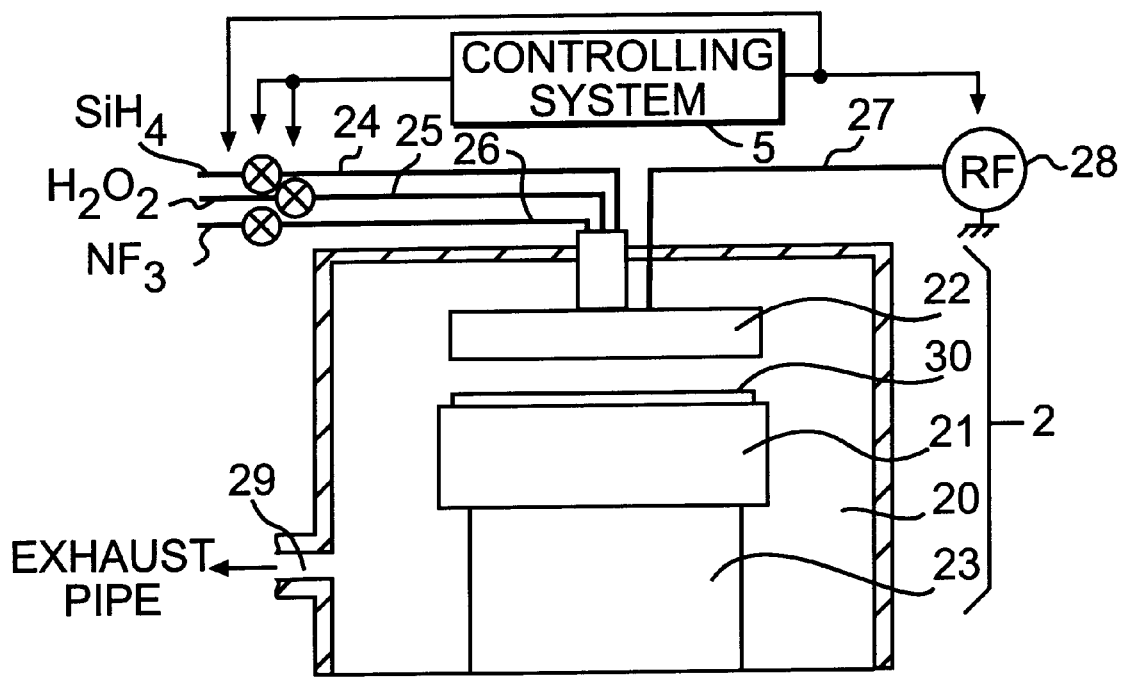
FIG. 4 is a schematic view showing one example of the low-pressure CVD apparatus to be used for the apparatus of FIG. 1 and a control system for selecting a function.
Figure 5A:
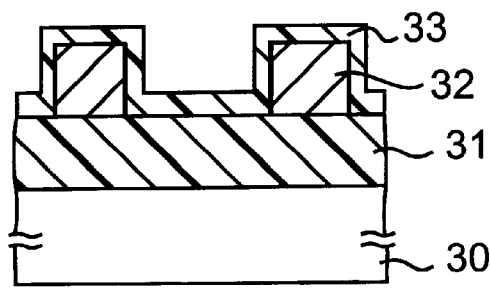
FIG. 5a–d is a sectional view showing an example of the multiple wiring layer process adopting the reflow insulating film forming technology to the interlayer insulating layer forming process according to a first embodiment of the method for manufacturing the semiconductor device according to the invention.
Figure 5B:
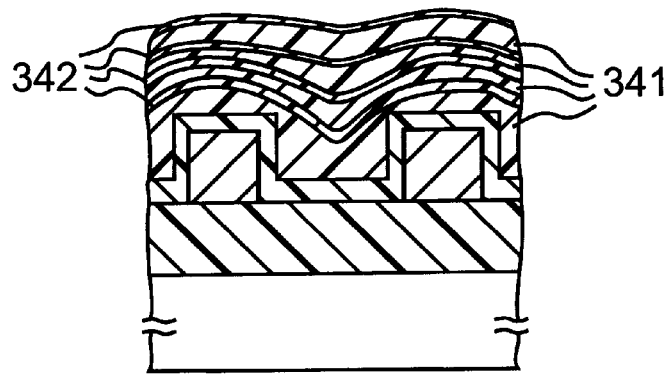
Figure 5C:
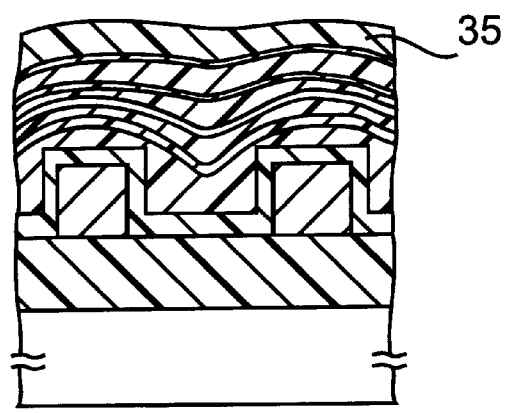
Figure 5D:
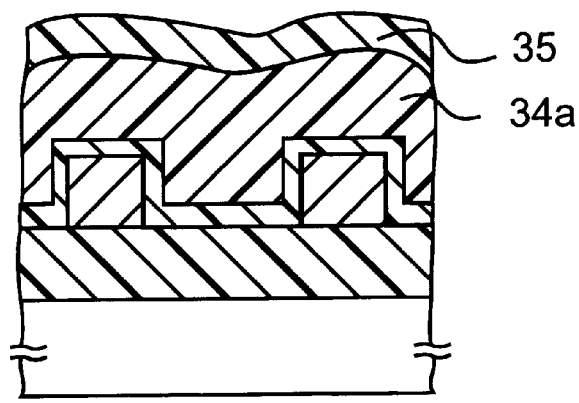

The plasma CVD apparatus 1 has a common structure and its structural example is schematically shown in FIG. 3. In FIG. 3, reference numeral 11 denotes a reaction chamber, 12 a top electrode (shower head), 13 a lower electrode (table), 14 an exhaust port, 15 a process gas supplier, and 16 a high frequency power supplier.

FIG. 3 schematically shows one example of the structure of the low-pressure CVD apparatus 2 together with a control system 5 for selecting a function. The low-pressure CVD apparatus 2 is configured by having an ordinary structured low-pressure CVD apparatus provided with a function which can alternately perform the deposition of the CVD insulating film and the plasma treatment of the surface of the CVD insulating film.

Specifically, the low-pressure CVD apparatus 2 has a reflow $SiO_2$ film depositing function for depositing the reflow $SiO_2$ film having a reflow form on the semiconductor substrate 30 by introducing $SiH_4$ gas and $H_2O_2$ into a chamber (reaction chamber) 20 and mutually reacting them in a vacuum of 665 Pa or below in a temperature range of $-10°$ C. or more to $+10°$ C. or below, and a plasma treating function for performing the plasma treatment of the surface of the reflow $SiO_2$ film by introducing $NF_3$ gas into the chamber 20 and effecting the plasma discharge in a given vacuum.

And, the control system 5 has a function to control a switching valve and an RF (Radio Frequency) source disposed on the respective supplying routes in order to alternately select the two functions of the low-pressure CVD apparatus 2.

In FIG. 3, reference numeral 21 is a single wafer processing wafer susceptor made of quartz which is provided within the chamber to position the semiconductor substrate (wafer) 30 on it.

Reference numeral 22 denotes a shower head which is provided within the chamber and leads $SiH_4$ gas and $H_2O_2$ onto the wafer 30, and it also serves as an upper electrode for plasma discharging. Reference numeral 23 is a table provided within the chamber and also serves as a lower electrode for plasma discharging.

Reference 24 denotes an $SiH_4$ gas feeding route for supplying $SiH_4$ gas from an $SiH_4$ gas supply source disposed outside of the chamber into the chamber. Reference numeral 25 denotes an $H_2O_2$ feeding route for supplying $H_2O_2$ from an $H_2O_2$ supply source disposed outside of the chamber into the chamber (for example, $H_2O_2$ is heated by a heater into the form of steam and supplied). Reference numeral 26 denotes an $NF_3$ gas feeding route for supplying $NF_3$ gas from an $NF_3$ gas supply source disposed outside of the chamber into the chamber. And, reference numeral 27 denotes a high frequency power supplier for supplying high frequency power from a radio frequency power source (RF source) 28 disposed outside of the chamber into the chamber.

The radio frequency power source 28 may be a radio frequency power source (generally supplies a radio frequency power of 400 KHz or below) which is used for the plasma CVD apparatus 10 and produces the radio frequency power of 400 KHz or below.

Reference numeral 29 denotes an exhaust port which is formed on the chamber and structured to set the chamber interior to a prescribed vacuum condition by a vacuum exhaust pump (not shown) disposed outside of the chamber and connected to the exhaust port via an exhaust pipe.

In the embodiment of the method for manufacturing the semiconductor device according to the invention, FIG. 5 (a) to FIG. 5 (d) show one example of the repetition of the deposition of the reflow $SiO_2$ film and the plasma treatment of the surface of the reflow $SiO_2$ film by adopting the semiconductor manufacturing apparatus and the reflow insulating film forming technology of FIG. 2 to the interlayer insulating layer forming step in the multiple wiring layer process.

As shown in FIG. 5 (a), an element area (not shown) and the like are formed on the semiconductor substrate (generally, a silicon wafer) 30, a lower insulation layer 31 is formed by the atmospheric pressure CVD method, and contact holes (not shown) are formed on the lower insulation layer 31.

Then, a first wiring material (e.g., aluminum containing 1% of Si and 0.5% of Cu) for the lower wiring layer is deposited, and the first wiring material is patterned by the photo-lithography method or the RIE (reactive ion etching) method to form the lower wiring layer 32.

By the semiconductor manufacturing method, an insulating layer is embedded among wirings of the lower wiring layer 32, and an insulating layer is deposited on the lower wiring layer to form the interlayer insulating layer.

In the interlayer insulating layer forming process, the plasma CVD insulating film 33 is formed as the first interlayer insulating layer (base insulating film) on the lower wiring layer 32. In this case, the semiconductor substrate 30 after forming the lower wiring layer is set on, e.g., a quartz board within the cassette load chamber 3. And, the cassette load chamber 3 interior is set to a given vacuum state by means of a vacuum pump (not shown), the semiconductor substrate 30 is carried into the reaction chamber 11 of the plasma CVD apparatus 1 by the robot arm 4. The reaction chamber 11 interior of the plasma CVD apparatus 1 is set to a given vacuum state, and the lower electrode 13 is set to approx. 300° C., then the first plasma $SiO_2$ film 33 having a thickness of 0.1 #m or more is formed on the entire surface of the semiconductor substrate 30.

Then, the semiconductor substrate 30 is carried from the chamber 11 of the plasma CVD apparatus 1 into the chamber 20 of the low-pressure CVD apparatus 2 and positioned on the wafer susceptor 21 by the robot arm 4. And, a reflow $SiO_2$ film 34a is deposited on the first plasma $SiO_2$ film 33 as shown in FIG. 5 (d).

In this case, $SiH_4$ gas is introduced at a prescribed flow rate into the chamber 20 of the low-pressure CVD apparatus 2 and $H_2O_2$ is introduced at a prescribed flow rate, and they are mutually reacted in a vacuum of 5 Torr=5×133.322 Pa (approx. 665 Pa) or below in a temperature range of −10° C. or more to +10° C. or below (e.g., 0° C.), to produce a reflow $SiO_2$ film 341 having a reflow form on the semiconductor substrate 30 as shown in FIG. 5 (b).

The reflow $SiO_2$ film 341 absorbs water when it is formed owing to its production process, and the reflow $SiO_2$ film 341 has a water content in it (water absorbed during the film forming).

Following the reflow film forming process, the residue gas in the chamber 20 is discharged by vacuum extraction, $NF_3$ gas is introduced into the chamber 20, and a high frequency signal having a prescribed electric energy of 400 KHz or below is supplied to the chamber 20 for a prescribed time to perform a plasma discharge in a prescribed vacuum (665 Pa or below in this case).

Thus, the surface of the reflow $SiO_2$ film 341 is plasma treated, and a high concentration F layer 342 is formed on the surface of the reflow $SiO_2$ film 341. Then, the residue gas within the chamber 20 is discharged by vacuum extraction.

In this embodiment, the above-described reflow film forming process and the plasma treating process are alternately performed a plurality of times to form the reflow $SiO_2$ film 341 and the high concentration F layer 342 in a plurality of layers.

In this case, to form the reflow $SiO_2$ film 34a having a film thickness T (e.g., 1.0 μm), the process of forming the reflow $SiO_2$ film 341 to a thickness t (e.g., approx. 0.2 μm) and the process of forming the high concentration F layer 342 by the plasma surface treatment with $NF_3$ gas in a vacuum within the same chamber 20 are repeated x (=T/t) cycles (five times in this case).

Then, the semiconductor substrate 30 is subjected to a prescribed thermal treatment, but in this case, the thermal treatment is performed by a furnace anneal process to be described afterward.

Then, the semiconductor substrate 30 is carried from the chamber 20 of the low-pressure CVD apparatus 2 to the reaction chamber 11 of the plasma CVD apparatus 1 by the robot arm 4. And, the second plasma CVD insulating film (e.g., a plasma CVD-$SiO_2$ film) 35 is formed as the second interlayer insulating layer (passivating layer) on the uppermost surface high concentration F layer 342 by the ordinary plasma CVD method as shown in FIG. 5 (c).

The semiconductor substrate 30 is removed from the plasma CVD apparatus 1 and placed in a furnace anneal chamber, then annealed at a high temperature of, e.g., 450° C. (generally, in the atmosphere) for approx. 30 minutes. Thus, a water content is removed from the reflow $SiO_2$ film 341 and F is diffused, so that the reflow $SiO_2$ film 34a containing SiOF is obtained as shown in FIG. 3 (d).

And, etching is performed to form contact holes or via holes in the interlayer insulating layer, the second wiring material (e.g., aluminum containing 1% of Si and 0.5% of Cu) for the upper wiring layer is deposited, and the upper wiring layer (not shown) is formed by patterning.

Specifically, in the above embodiment, the reflow insulating film forming technology is adopted to the interlayer insulating layer forming step in the multiple wiring layer process, to form the wiring pattern on the insulating film and to form the plasma CVD insulating film as a base film. Then, $SiH_4$ gas and $H_2O_2$ are introduced into the reaction chamber which accommodates the semiconductor substrate, and mutually reacted in a vacuum of 665 Pa or below in a temperature range of −10° C. or more to +10° C. or below to form the reflow $SiO_2$ film 341. After that, $NF_3$ gas is introduced into the reaction chamber and the plasma discharge is performed in a prescribed vacuum for the plasma treatment of the reflow $SiO_2$ film 341 surface to obtain the high concentration F layer 342. Then, the plasma CVD insulating film is formed as a passivating layer on the semiconductor substrate.

In this case, a step of forming the reflow $SiO_2$ film 341 by the low-pressure CVD method at a low temperature, and a step of forming the high concentration F layer 342 on the surface of the reflow $SiO_2$ film 341 by the plasma treatment with $NF_3$ gas are repeated for an appropriate number of times, then a water content is discharged from the reflow $SiO_2$ film 341 and SiOF is thermally treated to obtain the reflow $SiO_2$ film 34a, thereby obtaining a silicon-based oxidized film excelling in planarization and having a dielectric constant lower than that (approx. 3.9) of a thermal $SiO_2$ film.

In this connection, the dielectric constant of the reflow $SiO_2$ film 34a containing SiO obtained in this embodiment was assured to be approx. 3.7. As a result, the interlayer insulating layer containing the reflow $SiO_2$ film 34a has a small capacity (in its turn, wiring capacity).

Therefore, according to the above embodiment, the interlayer insulating layer excelling in planarization and having a low dielectric constant can be achieved at a low cost without undergoing the planarization process, so that following the low dielectric constant insulating film required for the high-speed MOS device, high-speed logic circuit and the like is facilitated, and the application to the high-speed device becomes easy.

And, the reflow $SiO_2$ film 34a containing the above SiOF has the capacity of embedding steps up to an aspect ratio of 3, enabling to cope with the minuting of the high-speed device. Besides, since it is possible to lower the height of the via holes by thinning the interlayer insulating layer, the reliability of the upper wiring layer within the via holes is improved.

Since the interlayer insulating layer having remarkable planarization is obtained, no adverse effect is applied to the deposition of the upper wiring layer material after forming the interlayer insulating layer and the patterning of the upper wiring layer. Therefore, serious defects such as the breaking of a wire due to stepped breakage of the upper wiring layer, short circuit, increase of a leak current on the interlayer insulating layer, and a drop of withstand pressure can be prevented from taking place. And, the upper wiring layer can be further made fine and reliable.

Since the film forming and plasma treatment can be performed within the same reaction chamber, the throughput of the process can be suppressed from lowering, and a series of processing can be performed in a vacuum until just before the upper layer plasma CVD insulating film is formed by depositing, so that the occurrence of a crack on the reflow $SiO_2$ film can be prevented.

The gas to be introduced at the time of the plasma treatment is not limited to the $NF_3$ gas but may be a fluorine-based gas containing fluorine and can be $CF_4$ gas, $C_2F_6$ gas, or $SF_6$ gas.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A method for manufacturing a semiconductor device comprising:

(a) forming a wiring pattern on an insulating film on a semiconductor substrate, (b) forming a reflow $SiO_2$ film having a reflow shape by introducing $SiH_4$ gas and $H_2O_2$ gas into a reaction chamber which accommodates said semiconductor substrate and mutually reacting the $SiH_4$ and $H_2O_2$ gases in a temperature range of about −10° C. to about +10° C. in a vacuum of about 665 Pa or below, (c) plasma treating a surface of said reflow $SiO_2$ film by introducing a gas including fluorine into said reaction chamber and discharging plasma in said reaction chamber, and (d) heat treating said semiconductor substrate.

2. The method of manufacturing the semiconductor device according to claim 1, wherein the gas including fluorine is selected from the group consisting of $NF_3$, $CF_4$, $C_2F_6$ and $SF_6$.

3. The method of manufacturing the semiconductor device according to claim 1, wherein said step (b) and said step (c) are alternately repeated in the same reaction chamber.

4. The method of manufacturing the semiconductor device according to claim 1, wherein said reflow $SiO_2$ film is formed to have a thickness t, and wherein said step (b) and said step (c) are alternatively repeated x times to produce a total reflow SiO2 film having a thickness T equal to x times t.

5. The method of manufacturing the semiconductor device according to claim 1, further comprising:

(e) forming a first plasma CVD insulating film on the semiconductor substrate by plasma-CVD, and (f) forming a second plasma CVD insulating film on the reflow $SiO_2$ film by plasma-CVD after completing the step (b) and the step (c).

6. The method of manufacturing the semiconductor device according to claim 3, further comprising:

(e) forming a first plasma CVD insulating film on the semiconductor substrate by plasma-CVD, and (f) forming a second plasma CVD insulating film on the reflow $SiO_2$ film by plasma-CVD after completing said step (b) and said step (c).

7. The method of manufacturing the semiconductor device according to claim 5, wherein said heat treating step includes the sub-step of furnace annealing after said step (f) to discharge water from said reflow $SiO_2$ film and diffused fluorine to obtain a reflow $SiO_2$ film containing SiOF.

8. The method of manufacturing the semiconductor device according to claim 6, wherein said heat treating step includes the sub-step of furnace annealing after said step (f) to discharge water from said reflow $SiO_2$ film and diffused fluorine to obtain a reflow $SiO_2$ film containing SiOF.

9. The method of manufacturing the semiconductor device according to claim 7, wherein said step (c) includes a plasma discharge by a high-frequency power at a frequency of 400 KHz or below within said reaction chamber.

10. The method of manufacturing the semiconductor device according to claim 8, wherein said step (c) includes a plasma discharge by a high-frequency power at a frequency of 400 KHz or below within said reaction chamber.

* * * * *